US010518646B2

(12) United States Patent
Pritelli et al.

(10) Patent No.: US 10,518,646 B2
(45) Date of Patent: Dec. 31, 2019

(54) INTEGRATED ELECTRONIC DEVICE WITH SOLID-STATE RELAY AND PRE-CHARGE CIRCUIT (71) Applicant: MAGNETI MARELLI S.p.A., Corbetta (IT)

(72) Inventors: Danilo Pritelli, Bologna (IT); Franco Ciampolini, Bologna (IT); Rosanna Suglia, Bologna (IT); Gianluca Aurilio, Caserta (IT)

(73) Assignee: MAGNETTI MARELLI S.p.A., Corbetta (IT)

( * ) Notice: Subject to any disclaimer, the term of this patent is extended or adjusted under 35 U.S.C. 154(b) by 0 days.

(21) Appl. No.: 15/983,371

(22) Filed: May 18, 2018

(65) Prior Publication Data

US 2018/0264953 A1 Sep. 20, 2018

Related U.S. Application Data (63) Continuation of application No. 15/050,516, filed on Feb. 23, 2016, now Pat. No. 10,046,647.

(30) Foreign Application Priority Data

Feb. 24, 2015 (IT) .......................... 102015902333073

(51) Int. Cl.
*B60L 11/18* (2006.01)
*H05K 7/14* (2006.01)
(Continued)

(52) U.S. Cl.
CPC ............. *B60L 11/1803* (2013.01); *H02J 1/02* (2013.01); *H03K 17/0822* (2013.01); *H03K 17/167* (2013.01); *H05K 7/1422* (2013.01)

(58) Field of Classification Search
CPC .................................................. B60L 11/1803
(Continued)

(56) References Cited

U.S. PATENT DOCUMENTS 6,488,107 B1  12/2002  Ochiai et al.
2004/0207378 A1  10/2004  Bucur et al.
(Continued)

FOREIGN PATENT DOCUMENTS

CN    101025436 A    8/2007
CN    102198799 A    9/2011
(Continued)

OTHER PUBLICATIONS

First Office Action for Chinese Patent Application No. 201610101889.1 dated Aug. 16, 2018.
(Continued)

*Primary Examiner* — Joseph Chang
(74) *Attorney, Agent, or Firm* — Howard & Howard Attorneys PLLC (57) ABSTRACT An electronic device including an electronic switch M1, an electrical pre-charge circuit and a measurement, command and diagnosis module. The main electronic switch M1 has a first electrical terminal D1, a second electrical terminal S1, and a main driving terminal G1. The main electronic switch M1 is adapted to take, based on a driving signal DRV, depending on the command signal CMD and on an enabling signal ENB, a closed condition or an open condition, wherein the first electrical terminal D1 is respectively connected to or disconnected from the second electrical terminal S1. The pre-charge electrical circuit is adapted to carry out, based on the command signal CMD, a pre-charge operation, aimed at equalizing the electric potentials (V1, V2) of the first and second terminals of the device, before the main electronic switch M1 takes a closed condition, upon of a transition from the open condition.

18 Claims, 5 Drawing Sheets

(51) Int. Cl.
*H03K 17/16* (2006.01)
*H03K 17/082* (2006.01)
*H02J 1/02* (2006.01)

(58) Field of Classification Search
USPC ........................................................ 307/10.1
See application file for complete search history.

(56) References Cited

U.S. PATENT DOCUMENTS

| | | | |
|---|---|---|---|
| 2006/0071557 A1* | 4/2006 | Osawa | B60L 3/0046 307/10.1 |
| 2006/0220601 A1 | 10/2006 | Horii | |
| 2011/0234177 A1 | 9/2011 | Kohara et al. | |
| 2013/0050880 A1* | 2/2013 | Rozman | H02H 3/025 361/18 |

FOREIGN PATENT DOCUMENTS

| | | |
|---|---|---|
| EP | 2368749 A2 | 9/2011 |
| WO | 2015011879 A1 | 1/2015 |

OTHER PUBLICATIONS

Italian Search Report dated Oct. 8, 2015 for Italian Application No. 102015902333073 (MI2015A000276).
Communication dated Nov. 4, 2016 enclosing the Extended European Search Report dated Oct. 27, 2016 for European Patent Application No. 16156448.9.
Non-Final Office Action for U.S. Appl. No. 15/050,516 dated Jan. 23, 2018.
Notice of Allowance for U.S. Appl. No. 15/050,516 dated Jun. 4, 2018.
Corrected Notice of Allowability for U.S. Appl. No. 15/050,516 dated Jun. 14, 2018.

* cited by examiner

INTEGRATED ELECTRONIC DEVICE WITH SOLID-STATE RELAY AND PRE-CHARGE CIRCUIT

CROSS-REFERENCE TO RELATED APPLICATIONS

The present application is a continuation application of U.S. application Ser. No. 15/050,516, filed on Feb. 23, 2016, and claims priority to and all the benefits of Italian Patent Application No. 102015902333073, filed on Feb. 24, 2015, both of which are hereby expressly incorporated herein by reference in their entirety.

BACKGROUND OF THE INVENTION

1. Field of the Invention

The present invention relates to an integrated electronic device with solid-state relay and pre-charge circuit. The invention also relates to a method for connecting/disconnecting two terminals, with pre-charge functions using such a device.

In particular, but not limited thereto, the invention relates to a solid-state electronic relay which can be used for electrically disconnecting/connecting a load from/to a battery for electrical or hybrid traction motor vehicles.

2. Description of the Related Art

Electrical systems with direct current power supply are considered, characterized by electrical generators, circuits with low line electrical impedance and loads with high input electrical capacitance, in which the loads may be connected or disconnected in controlled manner by the generators by means of relays or switches. In such systems, a controlled connection event (e.g., the closing of a relay) between a load and a generator, that were previously disconnected, may instantaneously cause a very high current flow. This occurs, for example, if the voltage at the terminals of the load, in disconnection conditions, is significantly different from the voltage supplied by the generator. The situation described above may cause considerable drawbacks to the generator, to the load, to the connection conductors and to the relays themselves.

A situation of this type may occur, for example, in the automotive context in systems for electrical or hybrid traction vehicles equipped with a source of electrical charge or electrical charge storage or battery adapted to store the electrical energy also used for traction. Such systems operate, for example, with power supply voltages equal to, or higher than 48 V (level that is considered high in the automotive context). Motion systems for an electrical or hybrid vehicle generally include a load group, in particular an electrical motor, adapted to generate the motion, driven by means of an inverter, which is electrically connected to a battery pack or battery group for storing the electrical energy. As mentioned, the battery typically has relatively high voltages, e.g., 48 V. The load group has a high input capacitance; the battery and load group are connected/disconnected by means of switches or relays arranged along a direct current bus, each relay being interposed between a battery terminal and a load terminal.

In such applications in the automotive sector, as in other application contexts, the aforesaid overcurrent problems, upon the closure of a connection, are particularly relevant.

In order to deal with such problems, devices and methods are known, which are suitable to implement a pre-charging function of the capacitances associated to the electrical loads, in order to limit the maximum circuit currents which could take place between the generator and the load itself.

Usually, such a pre-charge operation is carried out by means of ad hoc devices adapted to equalize the charge voltage to the generator voltage by means of a limited current charge of the capacitance associated to the load. In other terms, the pre-charge operation aims at reducing the difference between the voltages of the load and of the generator, before their connection, below an appropriately defined threshold level. Such pre-charge devices are usually external with respect to the relay.

In some more advanced known solutions, a pre-charge circuit is associated to the relay and/or integrated thereto. However, also such solutions require the presence of complex external control and diagnosis systems.

In this regard, it is worth noting that the pre-charge function requires a check of the correct result of the occurred electrical pre-charging. Indeed, the absence of such a check would make the protection guarantee offered by pre-charging uncertain, and ultimately would thwart the advantages thereof.

The check of the correct pre-charge result must be based on a careful diagnosis of the operation of the relay and of the pre-charge circuit.

In the known solutions, such a check is normally performed by diagnosis circuits/systems, external to the relays, which must be capable of acquiring high voltages and must be also electrically insulated with respect to the vehicle chassis.

So, in the aforesaid known solutions, even the more advanced ones in which there is a pre-charge circuit associated to the relay, problematic needs arise of having a complex and costly system of pre-charge acquisition, management and diagnosis and also the needs of making this system interoperate with each relay.

In light of the above, particularly in the context of automotive applications, but also in other application contexts, the need is strongly felt to have an electronic device with relays and pre-charge functions which is simple, highly integrated and capable of managing, concurrently with the interconnection operation of the circuit, also the related associated pre-charge and diagnosis operations and which, at the same time, is adapted to significantly reduce the weight and dimensions associated to the pre-charge and diagnosis devices.

SUMMARY OF THE INVENTION

It is the object of the present invention to provide an electronic device for connecting/disconnecting two terminals, connectable to a generator and to a load, the device being suitable to be used, for example, in a motion system of an electrical or hybrid traction vehicle, and allowing to at least partially solve the drawbacks described above with reference to the prior art, and to respond to the aforesaid needs particularly felt in the considered technical sector.

It is a further object of the present invention a motion system of an electrical or hybrid traction vehicle using such a device and a method for terminal connecting/disconnecting with pre-charge functions, also using such a device.

More specifically, the present invention is directed toward an electronic device for electrically connecting/disconnecting, based on a command signal (CMD), a first device terminal and a second device terminal connectable to an electrical generator and to an electrical load (L), respectively. The device includes at least one main electronic switch (M1), having a first electrical terminal (D1) connected to the first device terminal, a second electrical terminal (S1) connected to the second device terminal, and a main driving terminal (G1). The main electronic switch (M1) is adapted to take, based on a driving signal (DRV), depending on the command signal (CMD) and on an enabling signal (ENB), a closed condition or an open condition, wherein the first electrical terminal (D1) is respectively connected or disconnected to the second electrical terminal (S1). A pre-charge electrical circuit is connected between said first and second device terminal, and includes at least one impedance element and at least one pre-charge electronic switch (M2), arranged in series. The pre-charge electrical circuit is adapted to carry out, based on the command signal (CMD), a pre-charge operation, aimed at equalizing the electrical potentials (V1, V2) present at the first and at the second device terminal, before the main electronic switch (M1) takes a closed condition upon a transition from the open condition. A measurement, command and diagnosis module is adapted to detect a voltage difference ($\Delta V$) between the first and the second device terminal, and further adapted to generate the enabling signal (ENB) based on the detected voltage difference ($\Delta V$), and further adapted to generate, based on the detected voltage difference ($\Delta V$) and on the command signal (CMD), a status signal (STS) indicative of a start phase, of an in-progress phase and of a completion phase of the pre-charge operation carried out by the pre-charge electrical circuit. The main electronic switch (M1) and pre-charge electronic switch (M2) are power solid-state relays. The measurement, command and diagnosis module includes: a comparator module, adapted to detect the voltage difference ($\Delta V$) between the first and the second device terminal, and further adapted to carry out a comparison of the detected voltage difference ($\Delta V$) with a threshold voltage (VT), and further adapted to generate the enabling signal (ENB) based on said comparison. A command module receives the command signal (CMD) and is operatively connected to the comparator module to receive the enabling signal (ENB). The command module generates a control signal (CTR) based on the command signal (CMD), and further generates the driving signal (DRV), based on the command signal (CTR) and on the enabling signal (ENB), and also provides the driving signal (DRV) to the main electronic switch (M1) and provides the control signal (CTR) to the pre-charge electronic switch (M2). A diagnosis module, operatively connected to the command module to receive the control signal (CTR) and to the comparator module to receive the enabling signal (ENB). The diagnosis module generates a signal (ST) representative of the status signal (STS), based on said control signal (CTR) and enabling signal (ENB).

The present invention is also directed toward a motion system of an electrical or hybrid traction vehicle, including a battery pack suitable to provide a battery voltage (Vbat) between a positive terminal (+) and a negative terminal (−) of the battery pack, and a load group suitable to be electrically powered, through a load terminal (TL) of the load group, by the battery pack. An electronic device is arranged at a connection between the battery pack and the load group, wherein the first device terminal is connected to the positive terminal (+) of the battery pack, so that the electric potential (V1) at the first device terminal depends, when the main switch and pre-charge switch are open, on the battery voltage (Vbat); and wherein the second device terminal is connected to the load terminal (TL) of the load group, so that the electric potential (V2) at the second device terminal depends on the equivalent impedance of the load (L) of the load group.

The present invention is also directed toward a method for electrically connecting/disconnecting two terminals and for carrying out a related pre-charge operation, based on a command signal (CMD), by an electronic device interposed between said terminals. The method provides for the following phases when the command signal (CMD) demands a transition from disconnection to connection. The method includes the steps of activating a pre-charge operation, aiming at equalizing the electric potentials (V1, V2) at the first and second of said two terminals, reducing the difference between said electric potentials below a preset threshold value (VT). The electric potential difference ($\Delta V$) is measured between the first and second terminal, and based on the obtained measurement, an enabling signal (ENB) is generated suitable to enable the connection between the two terminals if the electric potential difference ($\Delta V$) is below the threshold value (VT), and on the contrary to inhibit the connection between the two terminals if the electric potential difference ($\Delta V$) is over the threshold value (VT). A driving signal (DRV), based on the command signal (CMD) and on the enabling signal (ENB), is generated in such a way that the driving signal (DRV) takes an activation value only when the command signal (CMD) demands the closure and the enabling signal (ENB) enables the connection between the two terminals.

The driving signal (DRV) is provided to an electronic solid-state switch (M1), included in the device, and adapted to take, based on the driving signal (DRV), a closed condition or an open condition, wherein the two terminals are, respectively, connected or disconnected, so that the electronic switch (M1) takes the closed condition only when the driving signal (DRV) takes an activation value. Based on the detected electric potential difference ($\Delta V$) and on the command signal (CMD), a status signal (STS) is generated indicative of each of the following situations: activation of the pre-charge operation, pre-charge operation in-progress, completion of the pre-charge operation when the detected electric potential difference ($\Delta V$) is below the threshold value (VT).

When the command signal (CMD) demands a transition from connection to disconnection, the driving signal (DRV), based on the command signal (CMD), is deactivated so that that the electronic switch (M1) takes the open condition and disconnects the two terminals. The steps of measuring the electric potential difference ($\Delta V$) and generating an enabling signal (ENB) are carried out by a comparator module and include: detecting the voltage difference ($\Delta V$) between the first and the second device terminal; carrying out a comparison of the detected voltage difference ($\Delta V$) with a threshold voltage (VT); and generating the enabling signal (ENB) based on said comparison. The steps of generating a driving signal (DRV) and providing the driving signal (DRV) are carried out by a command module, and include: receiving the command signal (CMD) and receiving the enabling signal (ENB); generating a control signal (CTR) based on the command signal (CMD), and generating the driving signal (DRV), based on the command signal (CTR) and on the enabling signal (ENB); providing the driving signal (DRV) to the main electronic switch (M1) and providing the control signal (CTR) to the pre-charge electronic switch (M2). The step of generating a status signal (STS) is carried out by a diagnosis module and includes: receiving the control signal (CTR) from the command module; receiving the enabling signal (ENB) from the comparator module;

generating a signal (ST) representative of the status signal (STS), based on said control signal (CTR) and enabling signal (ENB).

BRIEF DESCRIPTION OF THE DRAWINGS

Other advantages of the invention will be readily appreciated as the same becomes better understood by reference to the following detailed description when considered in connection with the accompanying drawings, wherein.

It is worth noting that equal or similar elements in the aforesaid figures will be indicated hereinafter with the same numeric or alphanumeric references.

DETAILED DESCRIPTION OF THE INVENTION

Figure 1:
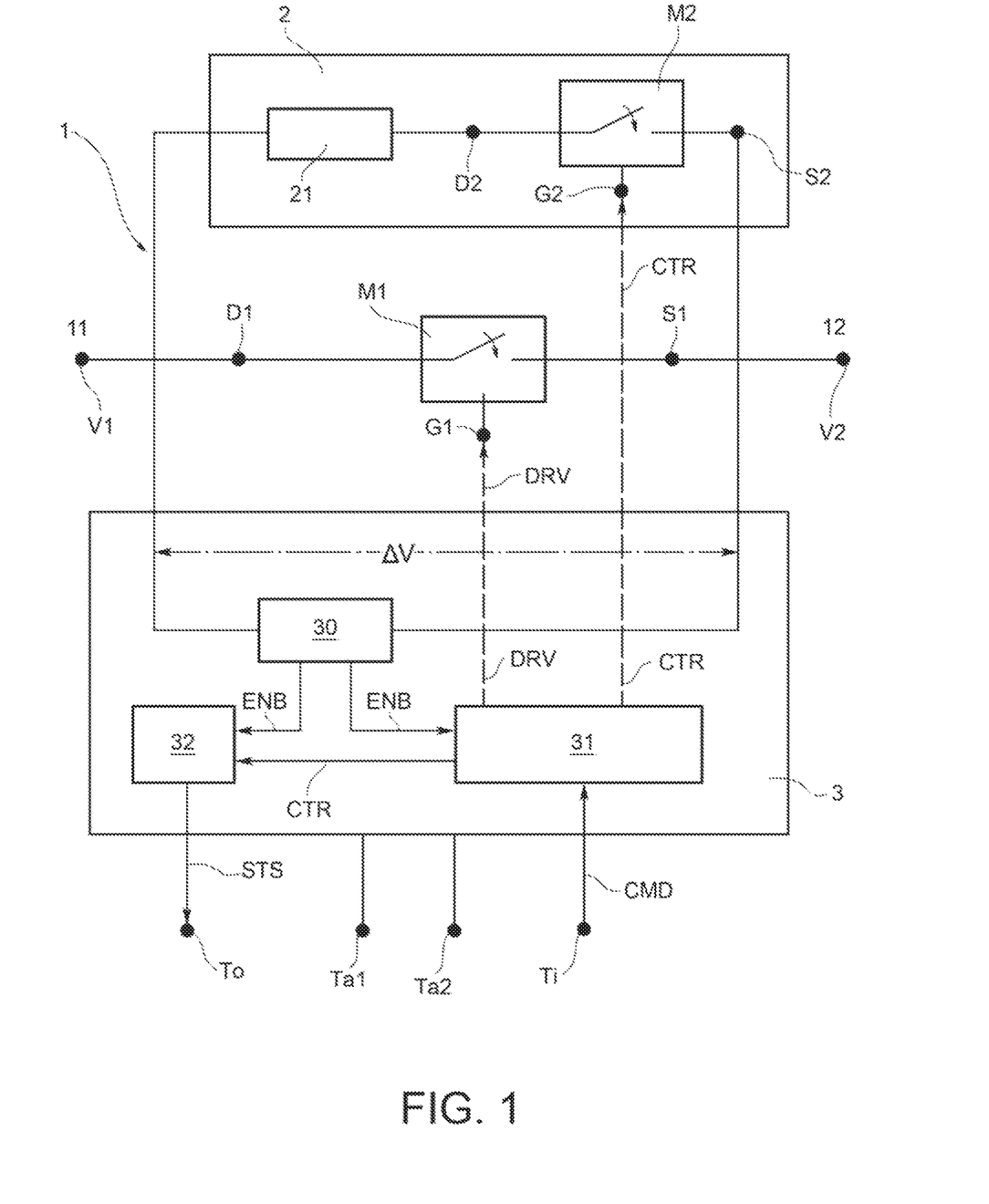
FIG. 1 shows a functional diagram of an electronic device according to an embodiment of the present invention.

With reference to FIG. 1, an electronic device 1 for electrically connecting and disconnecting, based on a command signal CMD, a first device terminal 11 and a second device terminal 12 is now described.

The first device terminal 11 is connectable to an electrical generator and the second terminal of the device 12 is connectable to an electrical load L.

The device 1 comprises at least one main electronic switch M1, an electrical pre-charge circuit 2 and a measurement, command and diagnosis module 3.

The main electronic switch M1 has a first electrical terminal D1 connected to the first device terminal 11, a second electrical terminal S1 connected to the second terminal of the device 12, and also a main driving terminal G1. The main electronic switch M1 is adapted to take, based on a driving signal DRV, depending on the aforesaid command signal CMD and on a further enabling signal ENB, a closed condition or an open condition, wherein the first electrical terminal D1 is respectively connected to or disconnected from the second electrical terminal S1.

The pre-charge electrical circuit 2 is connected between the aforesaid first 11 and second device terminal 12, and comprises at least one electrical impedance element 21 and at least one pre-charge electronic switch M2, arranged in series. The pre-charge electrical circuit 2 is adapted to carry out, based on the command signal CMD, a pre-charge operation, aimed at equalizing the electrical potentials (V1, V2) present at the first terminal 11 and second terminal 12 of the device, before the main electronic switch M1 takes a closed condition upon a transition from the open condition.

The aforesaid main electronic switch M1 and electronic pre-charge switch M2 are solid-state power relays (or power switches).

The measurement, command and diagnosis module 3 is adapted to detect a voltage difference $\Delta V$ between the first 11 and the second device terminal 12, and to generate the aforesaid enabling signal ENB based on the detected voltage difference $\Delta V$. The measurement, command and diagnosis module 3 is further adapted to generate, based on the detected voltage difference $\Delta V$ and on the command signal CMD, a status signal STS indicative of a start phase, of an in-progress phase and of a completion phase of the pre-charge operation carried out by the pre-charge electrical circuit 2.

It is worth noting that "pre-charge operation", according to the technical language commonly used by the sector experts, means an operation tending to equalize the two potentials present at the two terminals (11, 12) to be connected, i.e., more specifically, to reduce the difference between the electrical potentials (V1, V2), present at the terminals which must be connected, under a predetermined threshold value (VT). Such an operation is appropriate, or even necessary, in many application contexts and for the reasons explained above in illustrating the prior art.

Furthermore, the expression "completion of the pre-charge operation" means the condition reached at the time in which the difference between the electrical potentials (V1, V2), present at the terminals to be connected, is lower than the predetermined threshold value VT.

According to an embodiment, the device 1 is adapted to receive, as command signal CMD, a digital command signal CMD that can take an opening logic level, suitable to cause the open condition of the pre-charge electronic switch M2, and a closure logic level, suitable to cause the closed condition of the pre-charge electronic switch M2.

The device 1 is further adapted to provide the aforesaid status signal STS to an output terminal To of the device 1.

The status signal STS is a digital signal suitable to take a first status logic level or a second status logic level.

In accordance with an implementation option, a transition of the status signal STS from the second to the first status logic level indicates a start phase of the pre-charge operation. A transition of the status signal STS from the first to the second status logic level, detected with a preset time delay $\Delta T$ with respect to a previous transition from the second to the first status logic level, and in presence of a closure logic level of the command signal CMD, indicates a completion phase of the pre-charge operation. In presence of a closure logic level of the command signal CMD, a missed detection of the expected transition of the status signal STS from the first to the second status logic level, after the aforesaid preset time delay $\Delta T$ with respect to the previous transition from the second to the first status logic level, indicates a situation of non-completion of the pre-charge operation.

According to an embodiment, the device 1 is adapted so that the aforesaid driving DRV and enabling ENB signals are digital signals, characterized as defined here below.

The enabling signal ENB can take an enabling logic level and a disabling logic level.

The driving signal DRV, as already observed, depends on the command signal CMD and on the enabling signal ENB. In particular, when the command signal CMD takes the closure logic level and the enabling signal ENB takes the enabling logic level, the driving signal DRV takes a first logic driving level, suitable to cause the closed condition of the main electronic switch M1 (thus connecting the terminals of the device). In all the other combinations of digital values of the control signal and the enabling signal, the driving signal DRV takes a second driving logic level, suitable to cause the open condition of the main electronic switch M1 (thus keeping the terminals of the device disconnected).

The status signal STS takes the aforesaid first status logic level, when the command signal CMD takes the closure logic level and the enabling signal ENB takes the disabling logic level, and otherwise it takes the aforesaid second status logic level for all the other logic level combinations of the command signal and the enabling signal.

Figure 5A:
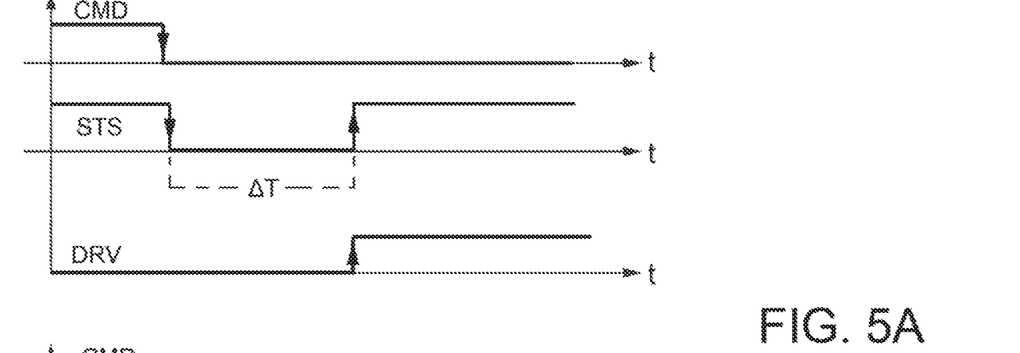
FIG. 5A shows respective time diagrams of logical signals relevant for the operation of the device.
Figure 5B:
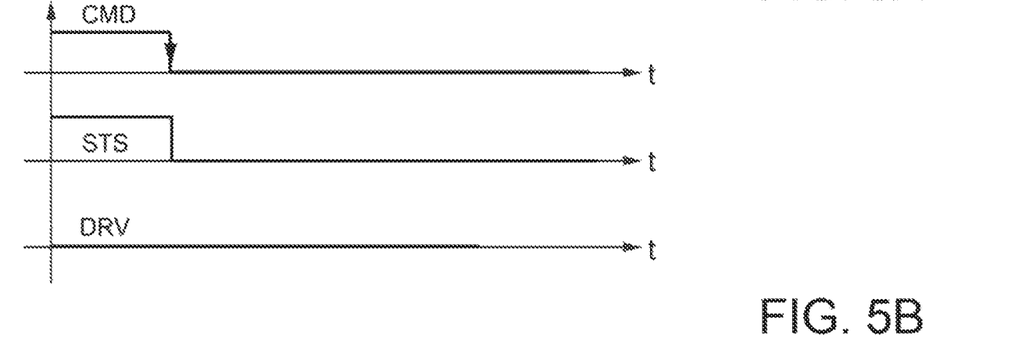
FIG. 5B shows respective time diagrams of logical signals relevant for the operation of the device.

The behaviour described above is illustrated by way of example in the time diagrams shown in FIGS. 5A and 5B. In such figures, by way of example, it is assumed that the open and closure logic levels of the command signal CMD correspond to a high and low physical levels, respectively; that the first and the second status signal levels STS correspond to a low and high physical levels, respectively; that the first and the second logic driving levels of the driving signal DRV correspond to a high and low physical levels, respectively. For the sake of clarity, it is further assumed that the logic transitions occur instantaneously and that the propagation delays in the respective logic circuits are zero (in reality, delays and up/down times are not zero, but they are negligible with respect to the duration of the phenomena which are of interest for the purposes of the present invention).

FIG. 5A shows the case in which a pre-charge operation is correctly completed: when the command signal CMD has a high-to-low transition (suitable to impart a closure command), the pre-charge operation is activated and this is immediately indicated by the high-to-low transition of the status signal STS; at the same time, the driving signal DRV remains low, thus keeping the main electronic switch M1 momentarily open. After the time delay ΔT, the pre-charge operation may be considered completed at the time in which the voltage difference ΔV is reduced below a predetermined threshold VT. Concurrently, by the measurement, command and diagnosis module 3, the driving signal DRV takes its high level, thus activating the closure of the main switch M1 (which may now occur in safe conditions, after the completion of the pre-charge operation); furthermore, the status signal STS, by a low-to-high transition, indicates this situation and, ultimately, the occurred connection between the two terminals 11, 12.

FIG. 5B shows the case in which a pre-charge operation is not correctly completed. This is reflected in that, unlike the case shown in FIG. 5A, the status signal STS does not show the low-to-high transition: this indicates that the pre-charge operation was not completed correctly. In absence of further external interventions, the signals follow the pattern shown in FIG. 5B; obviously, in this case, it is possible, and sometimes necessary, to externally deactivate the command signal CMD (e.g., by a higher-level controller) to prevent damage to the pre-charge circuit. Such a protection operation is enabled in that the device 1 provides a status signal which is indicative of whether the pre-charge operation was completed correctly or not.

Figure 5C:
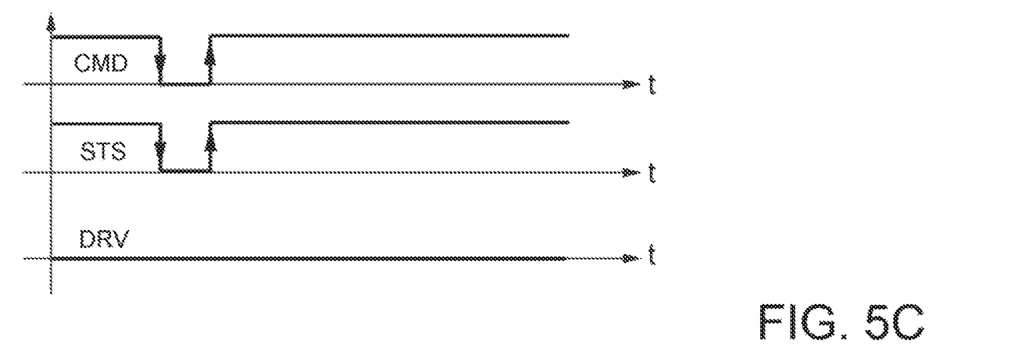
FIG. 5C shows respective time diagrams of logical signals relevant for the operation of the device.

FIG. 5C shows the further case in which the command signal imposes the opening of the main switch M1 during the pre-charge operation: in such a case, simply, the main switch is opened and the pre-charge operation is interrupted, which does not cause risks because the condition which makes pre-charge necessary (i.e., the closure command of the main switch M1) ceased.

Figure 5D:
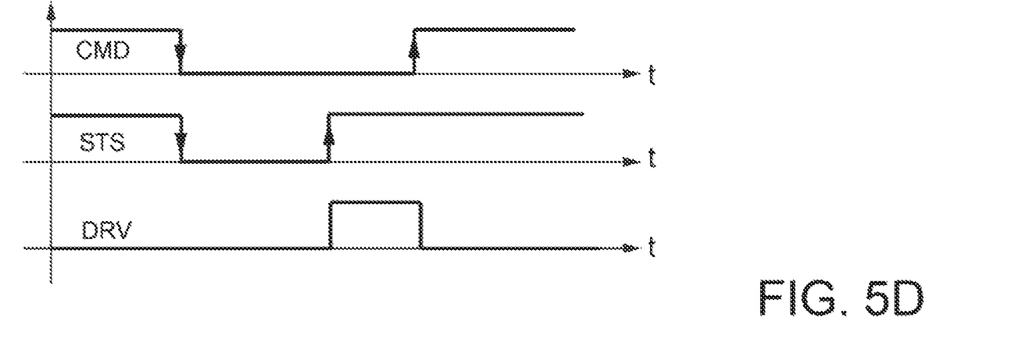
FIG. 5D shows respective time diagrams of logical signals relevant for the operation of the device.

FIG. 5D shows the further case in which the command signal imposes the opening of the main switch M1 at any time in which no pre-charge operation is underway. In such a case, simply, the main switch (which is in closed condition, since the time the previous pre-charge operation, caused by the previous closure command, has been completed) is open.

Now turning back to the components of the device 1, it is worth noting that, in an embodiment of the device (such as that shown in FIG. 3), the main electronic switch M1 comprises a main power MOSFET transistor M1, having a main MOSFET driving terminal G1, a main MOSFET first electrical terminal D1 and a main MOSFET second electrical terminal S1.

In accordance with a further example of implementation of the device (also shown in FIG. 3), the pre-charge electronic switch M2 comprises a pre-charge power MOSFET transistor M2, having a pre-charge MOSFET driving terminal G2, a pre-charge MOSFET first conductive terminal D2 and a pre-charge MOSFET second conductive terminal S2.

Figure 3:
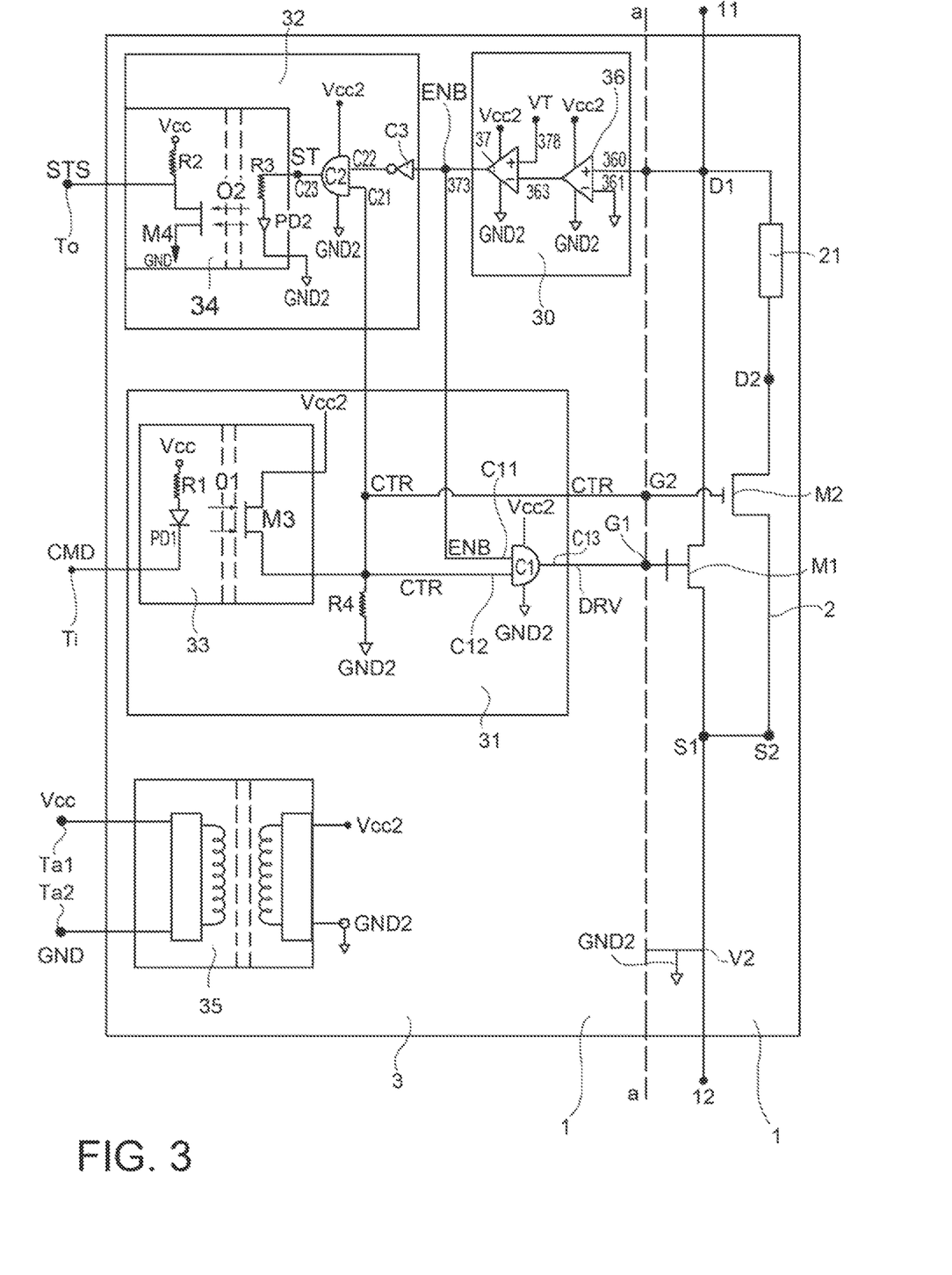
FIG. 3 schematically shows, from a logical/circuital point of view, an electronic device according to an embodiment of the invention.

In such a case, according to a particular implementation option, the at least one impedance element 21 of the pre-charge circuit 2 is connected between the first device terminal 11 and the pre-charge MOSFET first conductive terminal D2, and the pre-charge MOSFET second conductive terminal S2 is connected to the second device terminal 12.

In accordance with different implementation examples, the impedance element 21 comprises one or more resistors 210 electrically arranged in series.

Figure 4A:
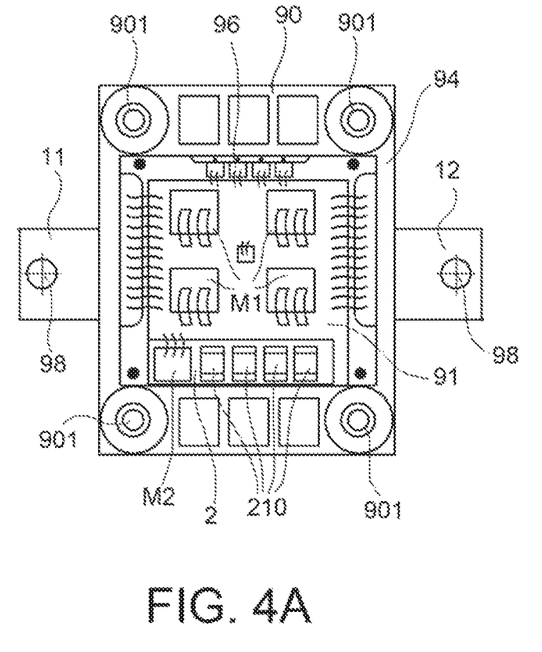
FIG. 4A shows elements forming a tridimensional structure of an example of implementation of the device in FIG. 1.

According to other embodiments of the device (one of which is shown, from the structural point of view, in FIG. 4A), each of the at least one main electronic switch M1 comprises two or more MOSFET power transistors connected to each other in parallel and/or in series.

According to further embodiments of the device (not shown in the figures), each of the at least one electronic pre-charge switch M2 may comprise two or more MOSFET power transistors connected in parallel and/or in series.

In accordance with an embodiment of the device (shown in FIG. 3), the measurement, command and diagnosis module 3 comprises a comparator module 30, a command module 31 and a diagnosis module 32.

The comparator module 30 is adapted to detect the voltage difference ΔV across the first 11 and the second device terminal 12, and to carry out a comparison of the detected voltage difference ΔV with a threshold voltage VT. The comparator module 30 is further adapted to generate the enabling signal ENB based on such a comparison.

The command module 31 is suitable to receive the command signal CMD and is operatively connected to the comparator module 30 to receive the enabling signal ENB. In the example of embodiment in FIG. 5, the command module 31 is adapted to generate a control signal CTR based on the command signal CMD, and further to generate the driving signal DRV, based on the command signal CTR and on the enabling signal ENB; the command module 31 is further adapted to provide the driving signal DRV to the main electronic switch M1 and to provide the control signal CTR to the pre-charge electronic switch M2.

The diagnosis module 32 is operatively connected to the command module 31 to receive the control signal CTR (depending, in turn, on the command signal CMD) and to the comparator module 30 to receive the enabling signal ENB, and is adapted to generate a signal ST representative of the status signal STS, based on said control signal CTR and enabling signal ENB.

According to a particular embodiment of the device (also shown in FIG. 3), the aforesaid command module 31 comprises an input interface module 33, connected to the input terminal Ti to receive the command signal CMD and adapted to generate the control signal CTR. The input interface module 33 comprises an opto-isolated circuit 33 provided with a first photodiode PD1, electrically connected to the input terminal Ti, and with a first interface transistor M3, optically connected to the photodiode PD1 to receive a first optical signal O1 emitted by the photodiode PD1, representative of the command signal CMD; the first interface transistor M3 is suitable to generate the control signal CTR based on the first optical signal O1.

Furthermore, the diagnosis module 32 comprises an output interface module 34, connected to the output terminal To to provide the status signal STS. The output interface module 34 comprises an opto-isolated circuit 34, provided with a second photodiode PD2, electrically connected to the diagnosis module 32 to receive the signal ST representative of the status signal, and with a second interface transistor M4 optically connected to the photodiode PD2 to receive a second optical signal O2 emitted by the photodiode PD2, representative of the status signal STS; the second interface transistor M4 is suitable to generate the status signal STS based on the second optical signal O2.

In such an embodiment, the measurement, command and diagnosis module 3 further comprises an opto-isolated DC/DC converter module 35, adapted to generate internal reference voltages (Vcc2, GND2) based on supply voltages (Vcc, GND) provided at the supply terminal (Tc1, Tc2). In particular, the "high" reference voltage Vcc2 is referred to a ground GND2, which is galvanically isolated with respect to the ground GND. In the example shown in FIG. 3, the voltage V2 at the second terminal of the device 12 is chosen as local ground reference (GND2) for the device 1. Such a local ground (GND2=V2) may vary over time, as absolute value, but always acts, during the operation of the device, as "low" reference voltage, and based thereon, by virtue of the DC/DC converter module 35, the "high" reference voltage Vcc2 is also defined.

Again, with reference to FIG. 3, further implementation details will now be illustrated with reference to the comparator module 30, the command module 31 and the diagnosis module 32, according to further particular implementation options of the device of the invention.

According to an implementation option, the comparator module 30 comprises a first 36 and a second 37 operational amplifiers. The first operational amplifier 36 has a first 360 and a second comparator input 361, connected respectively to the first device terminal 11 and to the second device terminal 12 (i.e., to the local ground GND2), and an output 363. The second operational amplifier 37 has a third comparator input 378 suitable to receive the threshold voltage VT, and a further input connected to the output 363 of the first operational amplifier 36, and further has a second operational amplifier output 373, suitable to provide the enabling signal ENB.

According to an implementation option, the command module 31 comprises a first AND logic gate (C1) having two inputs (C11, C12), to which the enabling signal ENB and the control signal CTR are provided respectively; the output (C13) of the first AND logic gate (C1) is connected to the driving terminal G1 of the main electronic switch to provide the driving signal DRV.

According to an implementation option, the diagnosis module 32 comprises a NOT logic gate (C3) and a second AND logic gate (C2). The NOT logic gate (C3) is connected to the output 373 of the comparator module 30 to receive the enabling signal ENB and generate the logical complement thereof. The second AND logic gate (C2) has two inputs (C21, C22), respectively connected to the command module 31 to receive the control signal CTR, and to the output of the NOT logic gate (C3) to receive the logical complement of the enabling signal ENB; the output (C23) of the second AND logic gate (C2) is suitable to provide the signal ST representative of the status signal STS.

Further operation details of an embodiment of the device 1 are illustrated below, with reference again to FIG. 3. We will assume that the considered signals are characterized by the same mappings between logical levels and physical levels previously illustrated with reference to FIGS. 5A-5D. The signal status will be indicated as "low" or "high", for the sake of brevity, making reference to the physical levels.

When the device is not commanded, i.e., the connection of the terminals is not required, the CMD signal is high. The transistor M3 of the input module 33 is off and the respective source voltage is kept low (at GND2) through the resistor R4. Consequently, the control signal CTR is low. It is worth noting that the control signal CTR, which depends deterministically in any case on the command signal CMD, is the logical complement thereof, in this particular example. As the CTR signal is low, the MOSFET M2 of the pre-charge circuit is off and thus open. Furthermore, the output of the first AND logic gate (C1) is low, and thus the MOSFET M1 of the main electronic switch is also off, thus open, and the terminals of the device 11, 12 are disconnected.

In a typical operating condition of the device 1, in which the first terminal 11 is connected to a generator voltage V1, and the second terminal 12 is set to a load voltage V2 (equivalent to a ground GND2, for the device 1), the voltage ΔV between the terminals, detected by the operational amplifier 36, is higher than the threshold level VT. In such conditions, the operational amplifier 37 generates an enabling signal ENB that is low, i.e., at the disabling level. At the same time, the fact that the CTR signal is low implies that also the output of the second AND logic gate (C2), i.e., the signal representative of the status signal (ST), is at the low level. The photodiode PD2 and the transistor M4 of the output module 34 are thus off and the respective output—i.e., the status signal STS—is kept high, close to the voltage Vcc, through the resistor R2. It is worth noting that the signal ST, which is always deterministically correlated to the signal STS, is in this case the logical complement thereof.

When the device 1 is commanded, i.e., the connection of the terminal is required, the command signal CMD is taken to the ground GND, i.e., to a low level. The transistor M3 of the input module 33 is switched on and the respective source voltage takes a high level (Vcc2) through the resistor R4. Consequently, the control signal CTR is high. As a result of this, the MOSFET M2 of the pre-charge circuit is switched on, i.e., it is closed and becomes conductive, and the pre-charge operation is activated. The pre-charge begins to reduce the difference between the voltages V1 and V2 of the two terminals, but such a reduction occurs gradually. For example, in a typical device operating condition, in which the load L connected to the second terminal 12 is of capacitive type, the voltage time evolution is the time evolution of the charge of a circuit RC. Thus, during pre-charging, the voltage ΔV between the terminals 11 and 12, which is also being reduced, remains higher than the threshold level VT. Consequently, the enabling signal ENB, generated by the comparator 30, remains low, thus in disabling conditions. This implies that the output of the first AND logical gate (C1) remains low and that the MOSFET M1 of the main electronic switch remains off, thus open. On the other hand, both the input signals of the second AND logic gate (C2), i.e., the logical complement of the enabling signal ENB and the control signal CTR, are now high. So, the output of the second AND logic gate (C2)—i.e., the signal representative of the status signal ST—goes from low to high and, through the output module 34, the status signal STS switches from high to low, for the previously explained reasons.

The situation described above persists until the difference of potential (i.e., voltage) ΔV between the first 11 and the second terminal 12 remains higher than the threshold value VT. When the aforesaid voltage ΔV becomes lower than the threshold voltage VT, the enabling signal ENB, generated by the comparator 30, becomes high, thus in enabling conditions. This implies that the output of the first AND logic gate (C1) becomes high and that the MOSFET M1 of the main electronic switch is activated, i.e., closed, to connect the terminals 11 and 12.

As already remarked, the pre-charge operation is considered correctly closed, by definition, at the instant in which the voltage ΔV across the device terminals becomes lower than the threshold value VT.

At the same time, the logical complement of the enabling signal ENB becomes low; the signal ST representative of the status signal, at the output of the second AND logical gate (C2), switches from high to low. The status signal STS, through the output module 34, switches from low to high. As described above, such a low-to-high transition of the status signal STS indicates the correct completion of the pre-charge operation.

The completion of the pre-charge operation occurs after a period of time ΔT, with respect to the start of the pre-charge operation. In the light of that illustrated above, it is understood that such a period of time ΔT depends, for example, on the charging time of the equivalent RC circuit formed by the pre-charge circuit 2 and the load L, and thus depends on the load L and the threshold value VT. If the load L is known, the threshold value VT can be set so as to obtain a known and predetermined value of the time period ΔT, the knowledge of which is useful to correctly interpret the transitions of the status signal STS.

It is worth noting that the threshold value VT also indicates the desired level of equalization between the voltages of the terminals 11 and 12, before closing the main switch. Such a threshold value VT may be, in principle, as small as desired. According to an implementation example, the threshold value VT may be set to fractions of volts or to a few volts, according to the voltage value that is expected (typically, at least several tens of volts) in the applications of use of the device.

Once the main switch M1 is closed, it behaves like a nearly perfect conductor having a nearly zero resistance, and the potential difference between the device terminals is nearly zero, as desired.

It is worth noting that the behaviour of the device 1, during this step, does not depend on the operating conditions of the pre-charge circuit 2, arranged in parallel to the main switch M1, and having a much higher impedance than that of the main switch M1 in closed condition.

As remarked above, the circuitry solution shown in FIG. 3 is only a non-limiting example which illustrates how to make a circuit which has the required functional behaviour, described above. Obviously, the invention comprises other circuitry solutions capable of providing the same functional and logical behaviour.

In a further implementation example, the device 1 could be lacking of the opto-isolated input 33 and output module 34, and could instead comprise two NOT logic gates.

According to another implementation option, the device 1 could be lacking of the opto-isolated input 33 and output modules 34 and could provide that the control signal CTR coincides with the command signal CMD (instead of being the logical complement thereof) and that the representative signal ST of the status signal coincides with the status signal STS (instead of being the logical complement thereof). In such a case, the behaviour of the circuit can be made equivalent to that shown above, by a different mapping between the logical and physical levels of the signals and a consequent coherent interpretation of the signals themselves.

In accordance with a further implementation option, the device 1 further comprises a microcontroller, adapted to receive and interpret the status signal STS and to deactivate the control signal CTR if the status signal STS indicates that the pre-charge operation has not been properly completed.

In accordance with an implementation example, the device 1 further comprises a programming interface EOL, suitable to allow a programming of the device. This may be useful, for example, for programming different threshold values VT, according to the context of application of the device.

Structural aspects of the device 1 will now be illustrated with reference to FIGS. 4A-4D, according to an embodiment.

According to such an embodiment, the device 1 has a tridimensional integrated structure, and comprises a frame 90, including the aforesaid first 11 and second device terminals 12, a metal support 94, fastened to the frame 90, and a first 91 and second 92 printed circuit boards. The first printed circuit board 91 is fastened to the metal support 94 in order to be fastened to the frame 90, and comprises the aforesaid at least one main electronic switch M1 and pre-charge electrical circuit 2 (in any one of the implementation options illustrated above).

The second printed circuit board 92 is fastened to the frame 90 such as to be overlapped to the first printed circuit board 91, and comprises the aforesaid measurement, command and diagnosis module 3 (in any one of the implementation options illustrated above).

Considering in particular the implementation option shown in terms of circuitry in FIG. 3, the partition of the components of the device 1 into the two printed circuit boards is pointed out by the dashed line "a", to the left of which there are indicated the components made in the second printed circuit board 92, and to the right of which there are indicated the components made in the first printed circuit board 91. As can be seen in FIG. 3, in this case, there are four electrical connections between the two portions (two at the electrical terminals D1, S1 of the main switch M1, and two at the driving terminals G1, G2 of the main switch M1 and of the pre-charge switch M2).

Accordingly, the frame 90 comprises first conductive elements 96, in this case arranged in a four-pole electrical connector; furthermore, the second printed circuit 92 comprises second conductive elements 96' suitable to be electrically connected to the first conductive elements 96, to form the aforesaid electrical connections between the device portions housed in the two different printed circuit boards, i.e., the "inner" PCB 91 and the "outer" PCB 92.

In accordance with an implementation option, the device further comprises a covering element 95, fixed to the frame 90, and adapted to house the first 91 and the second printed circuit board 92.

According to an implementation example, the frame 90 is manufactured by insert molding of plastic material with electrical- and/or mechanical-type elements.

Some construction details will now be described in greater detail, according to a particular embodiment of the device.

Figure 4B:
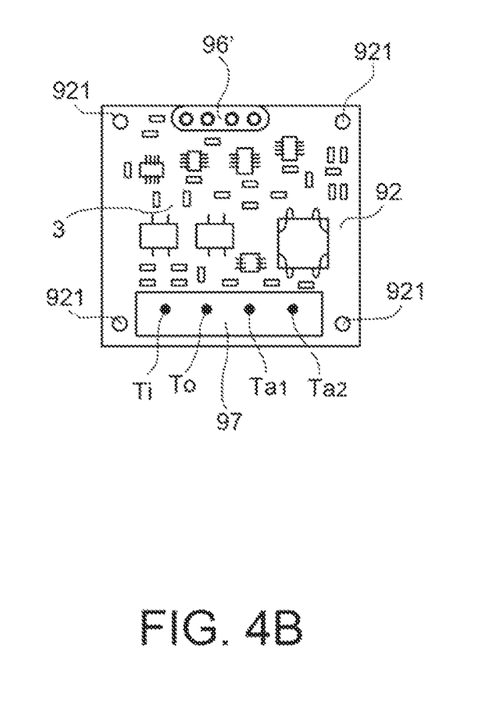
FIG. 4B shows elements forming a tridimensional structure of an example of implementation of the device in FIG. 1 or of the device in FIG. 2.
Figure 4C:
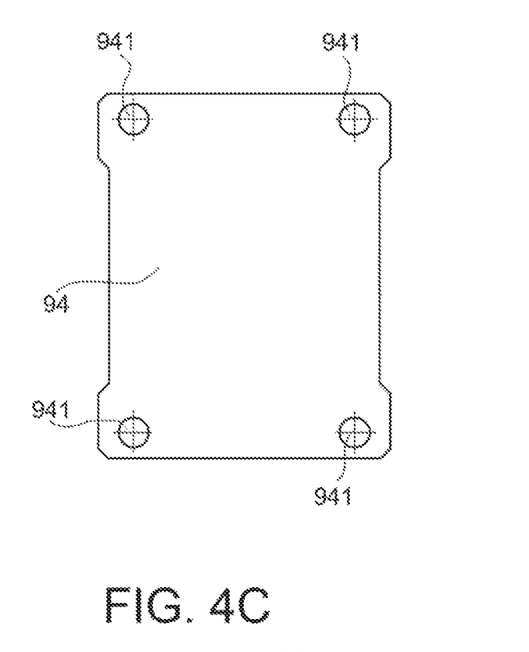
FIG. 4C shows elements forming a tridimensional structure of an example of implementation of the device in FIG. 1 or of the device in FIG. 2.

With reference to FIG. 4C, it is noted that the metal support 94 consists of a metal plate or foil substantially rectangular being, for example, approximately 78 mm long, approximately 55 mm wide and approximately 3 mm thick. Such a metal plate 94 is also adapted to operate as a heat sink element of the device 1. It also includes through holes 941, e.g., four through holes, proximal to the vertexes of the plate 94, each suitable to accommodate a respective fixing element for assembling the structure of the device 1.

With reference to FIG. 4A, it is noted that, in the frame 90, the terminals of the device 11, 12 protrude towards the outside of the frame along a same longitudinal axis of development of the frame in opposite directions, and they are made, e.g., of glazed copper alloy. Each terminal 11, 12 comprises a respective threaded through hole 98 arranged in distal position from the frame 90, and a stand-alone portion inside the frame, adapted to electrically connect, by metallic bonds, the respective terminal to the electronic components housed in the frame 90.

The frame 90 also includes fixing mechanisms, preferably fixing bushings 901, e.g., made of brass, in particular four bushings, to mechanically fix the frame 90 to a fixing structure external to the device. The bushings 901 are coaxial to the holes 941 of the plate 94.

The first printed circuit board 91 is made, for example, on a ceramic substrate, and comprises the power portion of the device 1. In particular, it comprises the transistors which form the main switch M1: in the example in FIG. 4A, there are four MOSFET, a first pair of p channel MOSFETs arranged mutually in parallel and a second pair of n channel MOSFETs arranged mutually in parallel, where the first and the second pairs are arranged in series in order to form the solid-state main switch M1. Such a solution is suitable for applications for currents up to 400-500 A. For higher currents, a corresponding implementation solution envisages the use of a higher number of MOSFETs connected to each other in parallel.

The first printed circuit board 91 further comprises the electrical pre-charge circuit 2, formed, in the example in FIG. 4A, by a further MOSFET M2 and by four resistors 210, arranged in series.

The second printed circuit board 92 (shown in FIG. 4B) is distinct from the first printed circuit board 91 and comprises the logic circuitry of the device 1, i.e., particularly, the measuring, command and diagnosis module 3. Furthermore, if present, the opto-isolated input 33 and output 34 interfaces are comprised in the second printed circuit board 92.

The second printed circuit board 92 further comprises an electrical connector 97 for interfacing the command, measuring and diagnosis module 3 with the outside of the device 1. Such an electrical connector 97 has the aforesaid input terminal Ti, output terminal To and power terminals Ta1, Ta2.

The second printed circuit board 92 comprises further through holes 921, associated to similar holes in the frame, adapted to house further fastening elements for fastening the second printed circuit board 92 on the frame so as to be overlapped on the first printed circuit board 91.

Figure 4D:
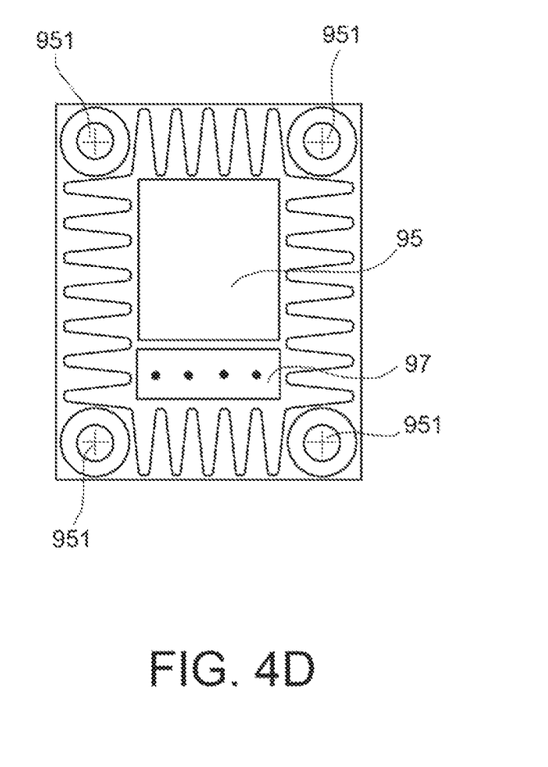
FIG. 4D shows elements forming a tridimensional structure of an example of implementation of the device in FIG. 1 or of the device in FIG. 2.

With reference to FIG. 4D, it is noted that the covering element or lid 95, for example made of plastic material, comprises inter alia an appropriate compartment at the connector 97 of the second printed circuit board 92. Furthermore, the lid 95 comprises respective through holes 951, in particular four holes, coaxial to the bushings 901 of the frame 90 to let such bushings pass through during assembly.

The assembly method of the tridimensional structure of the device 1 described above comprises the following steps.

The ceramic first printed circuit board 91 is fixed by welding to the metal support 94.

The metal support 94, welded to the first printed circuit board 91, is fixed, e.g., glued, to the frame 90.

The operation of electrical connection is then performed by metallic bondings to electrically connect the electronic devices associated to the first printed circuit board 91, and to connect the latter to the conductive elements 96 of the frame 90 and to the first 1 and second 2 device terminals.

The power circuits associated to the first printed circuit board 91 are covered by a protective gel.

The second printed circuit board 92 is fastened to the frame 90 by fasteners which bind the further holes 921 and corresponding holes of the frame, and is then electrically connected to the frame by further conductive elements 96'.

Finally, the plastic lid 95 is inserted and glued and covers the logic part contained on the second printed circuit board 92 and encases it all.

As a whole, the device 1 has two outward device terminals 11, 12, made of copper alloy; the connector 97 with four poles (Ti, To, Ta1, Ta2) and four brass bushings for the mechanical connection of the device 1 to an external heat sink (not shown in the figures).

Figure 2:
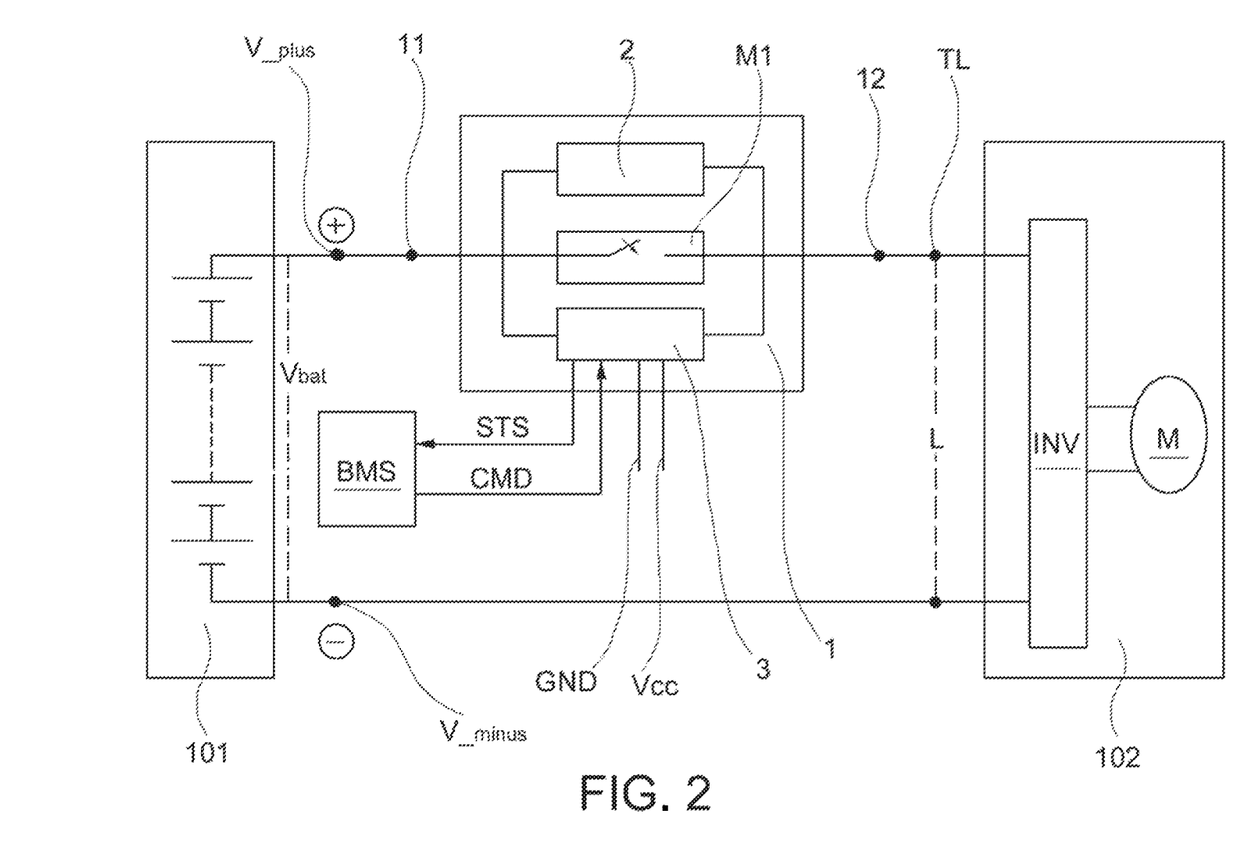
FIG. 2 schematically shows, from an electrical point of view, a motion system of an electrical or hybrid traction vehicle in which the device of FIG. 1 is employed.

Turning now to the application contexts, in a relevant application example, the device 1 is suitable to operate inside a motion system 100 of an electrical or hybrid vehicle, provided with a battery pack 101 and with a load group 102.

The device 1 is adapted to connect or disconnect said battery pack 101 to/from load group INV, M in a controlled manner.

In such a case, the first device terminal 11 is connectable to a positive terminal (+) of the battery pack 101. The second device terminal 12 is connectable to a load terminal TL of the load group 102.

With reference to FIG. 2, a motion system 100 of an electrical or hybrid traction vehicle using the device of the invention will now be described.

Such a system 100 comprises a battery pack 101, suitable to provide a battery voltage Vbat (e.g. 48 V) between a positive terminal (+), kept at a positive electric potential V_plus, and a negative terminal (−) of the battery, kept at a negative electric potential V_minus.

The system 100 further comprises a load group 102 suitable to be electrically powered, through a load terminal TL of the load group, by the battery pack 101.

The system 100 then comprises an electronic device 1 for connecting/disconnecting the two terminals with pre-charging functions, as illustrated above. The device 1 is arranged at connections between the battery pack 101 and the load group 102. The first device terminal 11 is connected to the positive terminal (+) of the battery pack 101, so that the electric potential V1 at the first device terminal 11 depends, when the main switch and pre-charge switch are open, on the battery voltage Vbat and/or, equivalently, from the voltage of the positive battery terminal (V_plus); the second device terminal 12 is connected to the load terminal TL of the load group 102, so that the electric potential V2 at the second device terminal 12 depends on the equivalent impedance of the load L of the load group 102.

According to an implementation option, the load group 102 is a motor (M)/inverter (INV) group.

According to an implementation example, one of the terminals of the load group 102 is connected to the second device terminal 12, while the other terminal of the load group 102 is connected to the negative terminal (−) of the battery pack 101.

In accordance with an embodiment, the system further comprises a battery control device BMS, operatively connected to the electronic device 1 to receive the status signal STS and to provide the command signal CMD. The battery control device BMS is adapted to interpret the status signal STS and to force the command signal CMD to the open logic level, if the status signal STS indicates that the pre-charge operation has not been properly completed.

According to an implementation option, the electronic device 1 is connected to a different generator (e.g., a conventional battery of the vehicle different from the battery pack 101) to receive the power supply voltage Vcc, and is also connected, for example, to the vehicle chassis to receive the ground GND, respectively, on the power supply terminals (Tc1, Tc2) of the device. The ground GND is electrically isolated with respect to the voltages at the terminals of the battery pack 101.

A method is described hereinafter for electrically connecting/disconnecting each other two terminals (11, 12), based on a command signal CMD, by an electronic device 1 interposed between said terminals (11, 12). The method includes the following steps.

When the command signal (CMD) demands a transition from disconnection to connection, the method provides activating a pre-charge operation, aiming at equalizing the electrical potentials (V1, V2) at the first 11 and second 12 of said two terminals, reducing the difference between said electrical potentials below a preset threshold value VT.

Then, the method provides measuring the electric potential difference ΔV between the first 11 and second terminal 12, and generating, based on the obtained measurement, an enabling signal ENB suitable to enable the connection between the two terminals 11, 12 if the electric potential difference ΔV is below the threshold value VT, and on the contrary to inhibit the connection between the two terminals 11, 12 if the electric potential difference ΔV is over the threshold value VT.

The method further provides generating a driving signal DRV, based on the command signal CMD and on the enabling signal ENB, in such a way that the driving signal DRV takes an activation value only when the command signal CMD demands the closure and the enabling signal ENB enables the connection between the two terminals 11, 12.

The method further comprises providing the driving signal DRV to an electronic solid-state switch M1, included in the device 1, and adapted to take, based on the driving signal DRV, a closed condition or an open condition, in which the two terminals 11, 12 are, respectively, connected or disconnected, so that the electronic switch M1 takes the closed condition only when the driving signal DRV takes an activation value.

Then, the method provides the step of generating, based on the detected electric potential difference (ΔV) and on the command signal CMD, a status signal STS indicative of each of the following situations: activation of the pre-charge operation, pre-charge operation in-progress, completion of the pre-charge operation when the detected electric potential difference ΔV is below the threshold value VT.

When the command signal CMD demands a transition from connection to disconnection, the method provides deactivating the driving signal DRV, based on the command signal CMD, so that the electronic switch M1 takes the open condition and disconnects the two terminals 11, 12. According to different implementation options of the method, it is carried out by an electronic device 1 according to any one of the embodiments of the device described above.

It can be observed that the object of the present invention is fully achieved by the device 1, by virtue of the functional and structural features thereof.

From the functional point of view, the device 1 integrates not only the functions of switch/relay and of pre-charge circuit but also diagnosis functions of the pre-charge result. In particular, the device 1 can provide a status signal indicative of the starting and of the completion of the pre-charge phase. In such a manner, it allows to avoid the need for a complex and costly external pre-charge diagnosis system; on the contrary, the device of the invention can be interfaced in a simple and effective manner with normal control/management, from which it receives the command signal and to which it supplies a significant status signal. Moreover, the device 1 can generate the status signal without the need to comprise a local microcontroller, which allows to improve compactness and simplicity of the device itself.

From the structural point of view, the device described above is compact and integrated. The power portion and logic portion of the device are appropriately partitioned into two different printed circuits, which are however incorporated in a single integrated device enclosed in a single frame-lid body.

Furthermore, the structure of the device allows a better management of the heat issues, in particular a better heat dissipation.

The device of the invention is thus compact and relatively cost-effective and can be advantageously installed in systems such as battery-load systems in electrical and hybrid vehicles.

Similar advantages can be identified with reference to the systems and methods employing the device described above.

A person skilled in art may make changes and adaptations to the embodiments of the device described above or can replace elements with others that are functionally equivalent to satisfy contingent needs without departing from the scope of protection of the appended claims. All the features described above as belonging to one possible embodiment may be implemented independently from the other described embodiments.

The invention claimed is:

1. An electronic device for electrically connecting/disconnecting, based on a command signal (CMD), a first device terminal and a second device terminal connectable to an electrical generator and to an electrical load (L), respectively, the device comprising:

at least one main electronic switch (M1), having a first electrical terminal (D1) connected to the first device terminal, a second electrical terminal (S1) connected to the second device terminal, and a main driving terminal (G1), the main electronic switch (M1) adapted to take, based on a driving signal (DRV), depending on the command signal (CMD) and on an enabling signal (ENB), a closed condition or an open condition, wherein the first electrical terminal (D1) is respectively connected or disconnected to the second electrical terminal (S1);

a pre-charge electrical circuit, connected between said first and second device terminal, comprising at least one impedance element and at least one pre-charge electronic switch (M2), arranged in series, the pre-charge electrical circuit adapted to carry out, based on the command signal (CMD), a pre-charge operation, aimed at equalizing the electrical potentials (V1, V2) present at the first and at the second device terminal, before the main electronic switch (M1) takes a closed condition upon a transition from the open condition;

a measurement, command and diagnosis module, adapted to detect a voltage difference (ΔV) between the first and the second device terminal, and further adapted to generate said enabling signal (ENB) based on the detected voltage difference (ΔV), and further adapted to generate, based on the detected voltage difference (ΔV) and on the command signal (CMD), a status signal (STS) indicative of a start phase, of an in-progress phase and of a completion phase of the pre-charge operation carried out by the pre-charge electrical circuit, wherein said main electronic switch (M1) and pre-charge electronic switch (M2) are power solid-state relays;

wherein the measurement, command and diagnosis module comprises:

a comparator module, adapted to detect the voltage difference (ΔV) between the first and the second device terminal, and further adapted to carry out a comparison of the detected voltage difference (ΔV) with a threshold voltage (VT), and further adapted to generate the enabling signal (ENB) based on said comparison;

a command module, suitable to receive the command signal (CMD) and operatively connected to the comparator module to receive the enabling signal (ENB), the command module adapted to generate a control signal (CTR) based on the command signal (CMD), and further adapted to generate the driving signal (DRV), based on the command signal (CMD) and on the enabling signal (ENB), and further adapted to provide the driving signal (DRV) to the main electronic switch (M1) and to provide the control signal (CTR) to the pre-charge electronic switch (M2);

a diagnosis module, operatively connected to the command module to receive the control signal (CTR) and to the comparator module to receive the enabling signal (ENB), the diagnosis module being adapted to generate a signal (ST) representative of the status signal (STS), based on said control signal (CTR) and enabling signal (ENB).

2. The device as set forth in claim 1, adapted to receive a command signal (CMD) that can take an opening logic level, suitable to cause the open condition of the pre-charge electronic switch (M2), and a closure logic level, suitable to cause the closed condition of the pre-charge electronic switch (M2);

the device being further adapted so as to provide said status signal (STS) to an output terminal (To) of the device, wherein the status signal (STS) is a digital signal suitable to take a first status logic level or a second status logic level, and wherein:

a transition of the status signal (STS) from the second to the first status logic level indicates a start phase of the pre-charge operation;

a transition of the status signal (STS) from the first to the second status logic level, detected with a preset time delay (ΔT) with respect to a previous transition from the second to the first status logic level, and in the presence of a closure logic level of the command signal (CMD), indicates a completion phase of the pre-charge operation;

in the presence of a closure logic level of the command signal (CMD), a missed detection of said transition of the status signal (STS) from the first to the second status logic level, after said preset time delay (ΔT) with respect to the previous transition from the second to the first status logic level, indicates a non-completion phase of the pre-charge operation.

3. The device as set forth in claim 2, adapted in such that said driving (DRV) and enabling (ENB) signals are digital signals, wherein:

the enabling signal (ENB) can take an enabling logic level and a disabling logic level;

the driving signal (DRV) takes a first driving logic level, suitable to cause the closed condition of the main electronic switch (M1) when the command signal (CMD) takes the closure logic level and the enabling signal (ENB) takes the enabling logic level, and otherwise it takes a second driving logic level, suitable to cause the open condition of the main electronic switch (M1);

the status signal (STS) takes said first status logic level when the command signal (CMD) takes the closure logic level and the enabling signal (ENB) takes the disabling logic level, and otherwise it takes said second status logic level.

4. The device as set forth in claim 1, having a tridimensional integrated structure, and comprising:

a frame including said first and second device terminals;

a metal support, fastened to the frame;

a first printed circuit board, fastened to the metal support in order to be fastened to the frame, and comprising said at least one main electronic switch (M1) and pre-charge electrical circuit;

a second printed circuit board, fastened to the frame such as to be overlapped to the first printed circuit board, and comprising said measurement, command and diagnosis module.

5. The device as set forth in claim 4, wherein the frame is manufactured through insert moulding of plastic material with electrical- and/or mechanical-type elements.

6. The device as set forth in claim 4, wherein the first and second printed circuit boards are mutually interconnected by first conductive elements (96) provided for in the frame, and respective second conductive elements provided for in the second printed circuit board, and wherein:

the second printed circuit board comprises an electrical connector to interface the command, measurement and diagnosis module outwards the device, said electrical connector comprising an input terminal (Ti), suitable to receive the command signal (CMD), an output terminal (To), suitable to provide the status signal (STS), and a couple of supply terminals (Ta1, Ta2).

7. The device as set forth in claim 1, wherein:

each of the at least one main electronic switch (M1) comprises a main power MOSFET transistor (M1), having a main MOSFET driving terminal (G1), a main MOSFET first electrical terminal (D1) and a main MOSFET second electrical terminal (S1);

each of the at least one pre-charge electronic switch (M2) comprises a pre-charge power MOSFET transistor (M2), having a pre-charge MOSFET driving terminal (G2), a pre-charge MOSFET first conductive terminal (D2) and a pre-charge MOSFET second conductive terminal (S2).

8. The device as set forth in claim 7, wherein the at least one impedance element is connected between the first device terminal and the pre-charge MOSFET first conductive terminal (D2), and the pre-charge MOSFET second conductive terminal (S2) is connected to the second device terminal,
and wherein each of said at least one impedance element comprises one or more resistors electrically arranged in series.

9. The device as set forth in claim 1, wherein:
the command module comprises an input interface module, connected to the input terminal (Ti) to receive the command signal (CMD) and adapted to generate the control signal (CTR), said input interface module comprising an opto-isolated circuit provided with a first photodiode (PD1) electrically connected to the input terminal (Ti), and with a first interface transistor (M3) optically connected to the photodiode (PD1) to receive a first optical signal (O1) emitted by the photodiode (PD1), representative of the command signal (CMD), the first interface transistor (M3) being suitable to generate the control signal (CTR) based on the first optical signal (O1);
the diagnosis module comprises an output interface module, connected to the output terminal (To) to provide the status signal (STS), said output interface module comprising an opto-isolated circuit provided with a second photodiode (PD2), electrically connected to the diagnosis module to receive the signal (ST) representative of the status signal, and with a second interface transistor (M4) optically connected to the photodiode (PD2) to receive a second optical signal (O2) emitted by the photodiode (PD2), representative of the status signal (STS), the second interface transistor (M4) being suitable to generate the status signal (STS) based on the second optical signal (O2);
the measurement, command and diagnosis module further comprises a DC/DC converter module, opto-isolated, adapted to generate internal reference voltages (Vcc2, GND2) based on supply voltages (Vcc, GND) present at the supply terminal (Tc1, Tc2).

10. The device as set forth in claim 1, wherein the comparator module comprises:
a first operational amplifier, having a first (360) and a second comparator input, connected respectively to the first and second device terminal, and an output;
a second operational amplifier, having a third comparator input suitable to receive the threshold voltage (VT), and a further input connected to the output of the first operational amplifier, and having an output of second operational amplifier suitable to provide the enabling signal (ENB).

11. The device as set forth in claim 9, wherein command module comprises a first AND logic gate (C1) having two inputs (C11, C12), to which the enabling signal (ENB) and the control signal (CTR) are provided respectively, wherein the output (C13) of the first AND logic gate (C1) is connected to the driving terminal (G1) of the main electronic switch to provide the driving signal (DRV),
and wherein the diagnosis module comprises:
a NOT logic gate (C3), connected to the output of the comparator module to receive the enabling signal (ENB) and generate the logical complement thereof;
a second AND logic gate (C2) having two inputs (C21, C22), respectively connected to the command module to receive the control signal (CTR), and to the output of the NOT logic gate (C3) to receive the logical complement of the enabling signal (ENB), wherein the output (C23) of the second AND logic gate (C2) is suitable to provide the signal (ST) representative of the status signal (STS).

12. The device as set forth in claim 1, further comprising a microcontroller, adapted to receive and interpret the status signal (STS) and to deactivate the control signal (CTR) if the status signal (STS) indicates that the pre-charge operation has not been properly completed.

13. The device as set forth in claim 1, also comprising an EOL programming interface, suitable to allow programming the device.

14. The device as set forth in claim 1, suitable to operate inside a motion system of an electrical or hybrid vehicle, provided with a battery pack and with a load group, the device being adapted to connect or disconnect in a controlled manner said battery pack and load group (INV, M), wherein:
the first device terminal is connectable to a positive terminal (+) of the battery pack;
the second device terminal is connectable to a load terminal (TL) of the load group.

15. The motion system of an electrical or hybrid traction vehicle, comprising:
a battery pack suitable to provide a battery voltage (Vbat) between a positive terminal (+) and a negative terminal (−) of the battery pack;
a load group suitable to be electrically powered, through a load terminal (TL) of the load group, by the battery pack;
an electronic device as set forth in claim 14 is arranged at a connection between the battery pack and the load group, wherein the first device terminal is connected to the positive terminal (+) of the battery pack, so that the electric potential (V1) at the first device terminal depends, when the main switch and pre-charge switch are open, on the battery voltage (Vbat); and wherein the second device terminal is connected to the load terminal (TL) of the load group, so that the electric potential (V2) at the second device terminal depends on the equivalent impedance of the load (L) of the load group.

16. The system as set forth in claim 15, wherein the load group is a motor (M)/inverter (INV) group.

17. The system as set forth in claim 16, further comprising a battery control device (BMS) operatively connected to the electronic device to receive the status signal (STS) and to provide the command signal (CMD), wherein the battery control device (BMS) is adapted to interpret the status signal (STS) and to force the command signal (CMD) to the open logic level, if the status signal (STS) indicates that the pre-charge operation has not been properly completed.

18. A method for electrically connecting/disconnecting two terminals and for carrying out a related pre-charge operation, based on a command signal (CMD), by an electronic device interposed between said terminals, the method providing for the following phases:
when the command signal (CMD) demands a transition from disconnection to connection:
activating a pre-charge operation, aiming at equalizing the electric potentials (V1, V2) at the first and second of said two terminals, reducing the difference between said electric potentials below a preset threshold value (VT);

measuring the electric potential difference (ΔV) between the first and second terminal, and generating, based on the obtained measurement, an enabling signal (ENB) suitable to enable the connection between the two terminals if the electric potential difference (ΔV) is below the threshold value (VT), and on the contrary to inhibit the connection between the two terminals if the electric potential difference (ΔV) is over the threshold value (VT);

generating a driving signal (DRV), based on the command signal (CMD) and on the enabling signal (ENB), in such a way that the driving signal (DRV) takes an activation value only when the command signal (CMD) demands the closure and the enabling signal (ENB) enables the connection between the two terminals;

providing the driving signal (DRV) to an electronic solid-state switch (M1), included in the device, and adapted to take, based on the driving signal (DRV), a closed condition or an open condition, wherein the two terminals are, respectively, connected or disconnected, so that the electronic switch (M1) takes the closed condition only when the driving signal (DRV) takes an activation value;

generating, based on the detected electric potential difference (ΔV) and on the command signal (CMD), a status signal (STS) indicative of each of the following situations: activation of the pre-charge operation, pre-charge operation in-progress, completion of the pre-charge operation when the detected electric potential difference (ΔV) is below the threshold value (VT);

when the command signal (CMD) demands a transition from connection to disconnection:

deactivating the driving signal (DRV), based on the command signal (CMD), so that that the electronic switch (M1) takes the open condition and disconnects the two terminals wherein said steps of measuring the electric potential difference (ΔV) and generating an enabling signal (ENB) are carried out by a comparator module and comprise:

detecting the voltage difference (ΔV) between the first and the second device terminal;

carrying out a comparison of the detected voltage difference (ΔV) with a threshold voltage (VT);

generating the enabling signal (ENB) based on said comparison;

wherein said steps of generating a driving signal (DRV) and providing the driving signal (DRV) are carried out by a command module, and comprise:

receiving the command signal (CMD) and receiving the enabling signal (ENB);

generating a control signal (CTR) based on the command signal (CMD), and generating the driving signal (DRV), based on the command signal (CMD) and on the enabling signal (ENB);

providing the driving signal (DRV) to the main electronic switch (M1) and providing the control signal (CTR) to the pre-charge electronic switch (M2);

wherein said step of generating a status signal (STS) is carried out by a diagnosis module and comprise:

receiving the control signal (CTR) from the command module;

receive the enabling signal (ENB) from the comparator module;

generating a signal (ST) representative of the status signal (STS), based on said control signal (CTR) and enabling signal (ENB).

* * * * *